(12) United States Patent
Cheng et al.

(10) Patent No.: US 7,973,324 B2
(45) Date of Patent: Jul. 5, 2011

(54) LAMP TYPE LIGHT EMITTING DEVICE FOR SAFETY FUSE

(76) Inventors: Wen-Tsung Cheng, Taoyuan (TW); Wen-Ho Cheng, Taoyuan (TW)

( * ) Notice: Subject to any disclaimer, the term of this patent is extended or adjusted under 35 U.S.C. 154(b) by 471 days.

(21) Appl. No.: 12/325,505

(22) Filed: Dec. 1, 2008

(65) Prior Publication Data
US 2010/0133552 A1 Jun. 3, 2010

(51) Int. Cl.
*H01L 33/00* (2010.01)
(52) U.S. Cl. ............... 257/81; 257/88; 257/99; 257/100; 313/331; 313/498; 313/512; 315/46; 315/51
(58) Field of Classification Search .................. 257/88, 257/99, 100, 81; 313/512, 331, 498; 315/46, 315/51
See application file for complete search history.

(56) References Cited

U.S. PATENT DOCUMENTS
2009/0045428 A1* 2/2009 Lin ................................ 257/99
* cited by examiner

*Primary Examiner* — Ken A Parker
*Assistant Examiner* — Anthony Ho
(74) *Attorney, Agent, or Firm* — Chun-Ming Shih; HDLS IPR Services

(57) ABSTRACT

A lamp type light emitting device for safety fuse, including a substrate, an electrode layer, a chip set, a wire set, two leads and an encapsulator. The electrode layer is arranged on the substrate and includes a first T-shaped electrode, a second T-shaped electrode, a first stripe electrode and a second stripe electrode. The chip set includes a first resistor chip and a first light emitting chip arranged on the first T-shaped electrode and a second resistor chip and a second light emitting chip arranged on the second T-shaped electrode. The wire set has fuse wires electrically connected the first resistor chip, the first light emitting chip, the first stripe electrode, the second resistor chip, second light emitting chip, and the second stripe electrode. The leads are electrically connected to the first and the second T-shaped electrodes. The encapsulator encapsulates the electrode layer, the chip set and the wire set.

6 Claims, 6 Drawing Sheets

LAMP TYPE LIGHT EMITTING DEVICE FOR SAFETY FUSE

BACKGROUND OF THE INVENTION

1. Field of the Invention

The present invention relates to a light emitting device, in particular to a lamp type light emitting device for safety fuse.

2. Description of Related Art

Safety fuses in car or other vehicle are electrically connected to control circuit of the car to prevent the control circuit from damaging by suddenly reverse current generated when the car is igniting or the switches thereof are turned on.

Conventional safety fuse includes a fuse wire electrically connecting between two conductive stripes which are packaged together in a shell. Once the fuse wire is burned out, it will not be possible to observe by a user outside the shell. The user has to plug and test all the safety fuses in a car one by one and consequently it wastes a lot of time. In order to improve the efficiency of the test, a low resistance light emitting diode is added into the safety fuse and is electrically connected between the two conductive stripes thereof. When the fuse wire is burned out, electrical current will flows into the light emitting diode to light it on. Therefore, after the safety fuse box is opened, the lighted-on blown safety fuse can notice the user for replacement.

But, since the low resistance light emitting diode is easy to burn out under a great amount of instantaneous current, a high resistance resistor is further electrically connected between the light emitting diode and one of the conductive stripes to limit maximum current flow to protect the light emitting diode. However, the multiple connections of the components of the safety fuse increase the difficulty of manufacturing.

SUMMARY OF THE INVENTION

The subject of present invention is to provide a lamp type light emitting device used for safety fuse and having resistance characteristic, which can be electrically connected between two conductive stripes of a safety fuse, capable of being installed between two conductive stripes of the safety fuse and bearing greater current flow when the light emitting device is lighted on.

In order to achieve aforementioned purpose, the present invention provides a lamp type light emitting device for safety fuse, including a substrate, an electrode layer, a chip set, a wire set, two leads and an encapsulator. The substrate has a top surface and a bottom surface. The electrode layer is arranged on the top surface of the substrate, the electrode layer includes a first T-shaped electrode, a second T-shaped electrode, a first stripe electrode and a second stripe electrode. The chip set includes a first resistor chip and a first light emitting chip arranged on the first T-shaped electrode and a second resistor chip and a second light emitting chip arranged on the second T-shaped electrode. The wire set has a plurality of fuse wires respectively electrically connected the first resistor chip to the first light emitting chip, the first light emitting chip to the first stripe electrode, the second resistor chip to the second light emitting chip, and the second light emitting chip to the second stripe electrode. The two leads are arranged on two opposite sides of the substrate and respectively electrically connected to the first T-shaped electrode and the second T-shaped electrode. The encapsulator encapsulates the electrode layer, the chip set and the wire set.

BRIEF DESCRIPTION OF THE DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

A detailed description of the present invention will be made with reference to the accompanying drawings.

Figure 1:
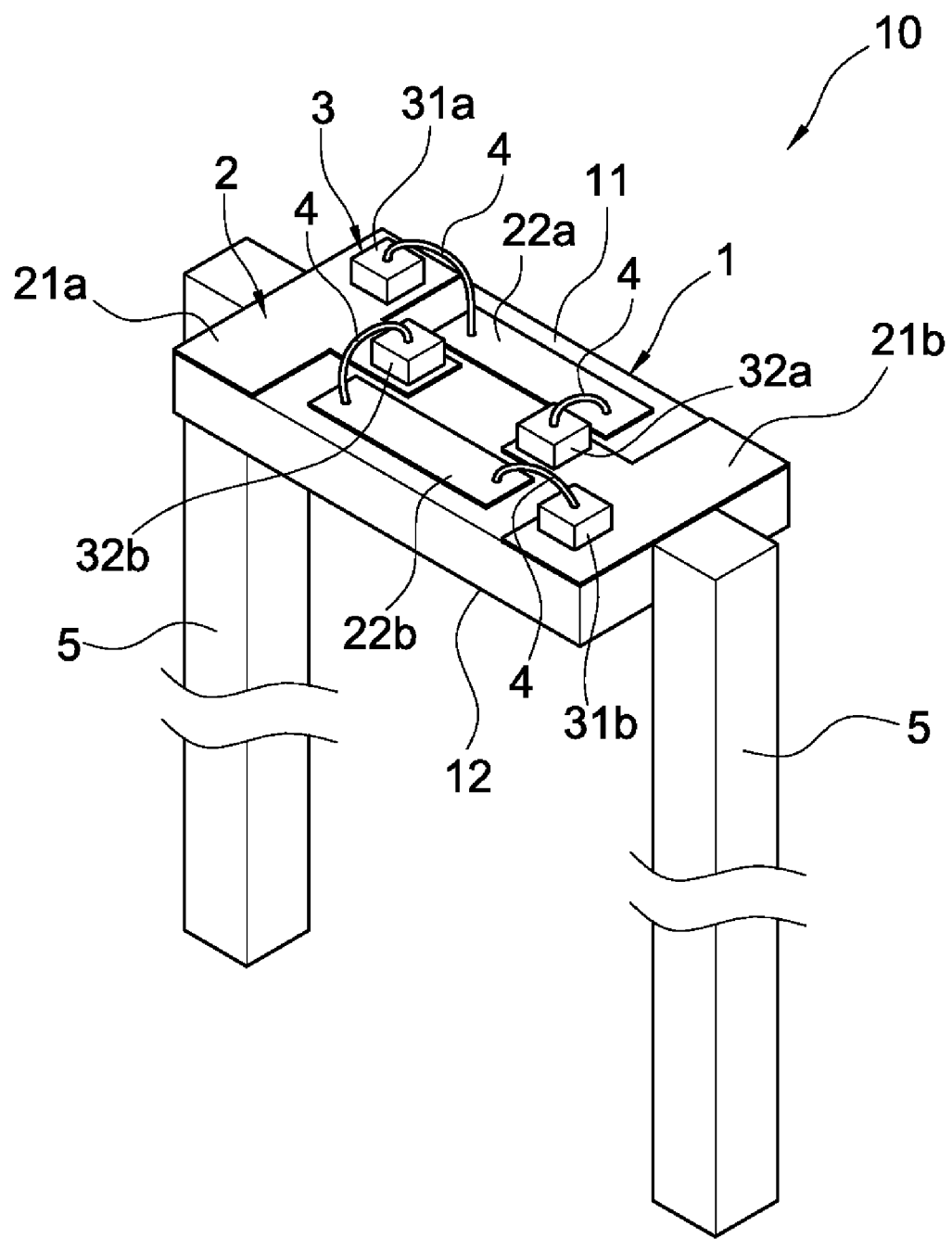
FIG. 1 is a perspective view of a lamp type light emitting device of the present invention.

FIG. 1 is a perspective view of the lamp type light emitting device for safety fuse of the present invention. The lamp type light emitting device 10 includes a substrate 1, an electrode layer 2, a chip set 3, a wire set 4 and two leads 5.

The substrate 1 has a top surface 11 and a bottom surface 12. In this embodiment, the substrate 1 is made of insulating material.

The electrode layer 2 is arranged on the top surface 11 of the substrate 1. The electrode layer 2 includes a first T-shaped electrode 21a, a second T-shaped electrode 21b, a first stripe electrode 22a and a second stripe electrode 22b. In this embodiment, the electrode layer 2 is made from copper foil.

The chip set 3 includes a first resistor chip 31a and a first light emitting chip 32a both arranged on the first T-shaped electrode 21a. Further, the chip set 3 also includes a second resistor chip 31b and a second light emitting chip 32b arranged on the second T-shaped electrode 21b. In this embodiment, the first resistor chip 31a and second resistor chip 31b are current limiting resistors for protecting the first light emitting chip 32a and the second light emitting chip 32b.

The wire set 4 has a plurality of fuse wires respectively electrically connecting the first resistor chip 31a to the first light emitting chip 32a, the first light emitting chip 32a to the first stripe electrode 22a, the second resistor chip 31b to the second light emitting chip 32b, and the second light emitting chip 32b to the second stripe electrode 22b. Therefore, a light emitting circuit with polarity-less operation is made of the aforementioned first and second set of circuit. In this embodiment, the fuse wires of the wire set 4 are gold wires.

The two leads 5 are arranged on two opposite sides of the substrate 1 and respectively electrically connected to the first T-shaped electrode 21a and the second T-shaped electrode 21b. The leads 5 are used as an output terminal and an input terminal of the light emitting circuit.

Figure 2:
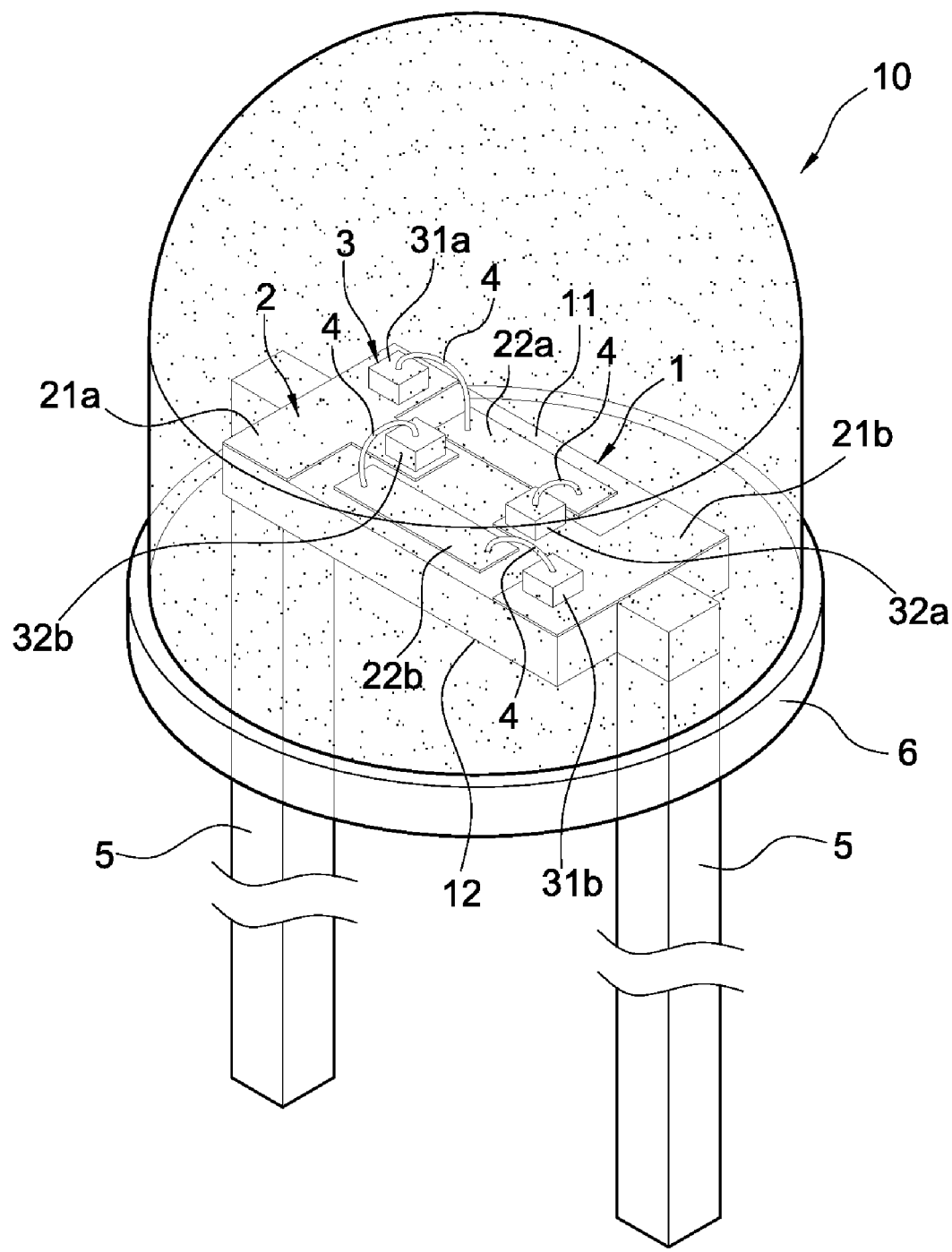
FIG. 2 is another perspective view of the lamp type light emitting device of the present invention.

FIG. 2 is a perspective view of the lamp type light emitting device for safety fuse of the present invention. The lamp type light emitting device can also include an encapsulator 6 for encapsulating the electrode layer 2, the chip set 3, and the wire set 4 to protect those components from exterior damage. Besides, a lens structure for modifying the light beam characteristic can be further formed on the encapsulator 6.

Figure 3:
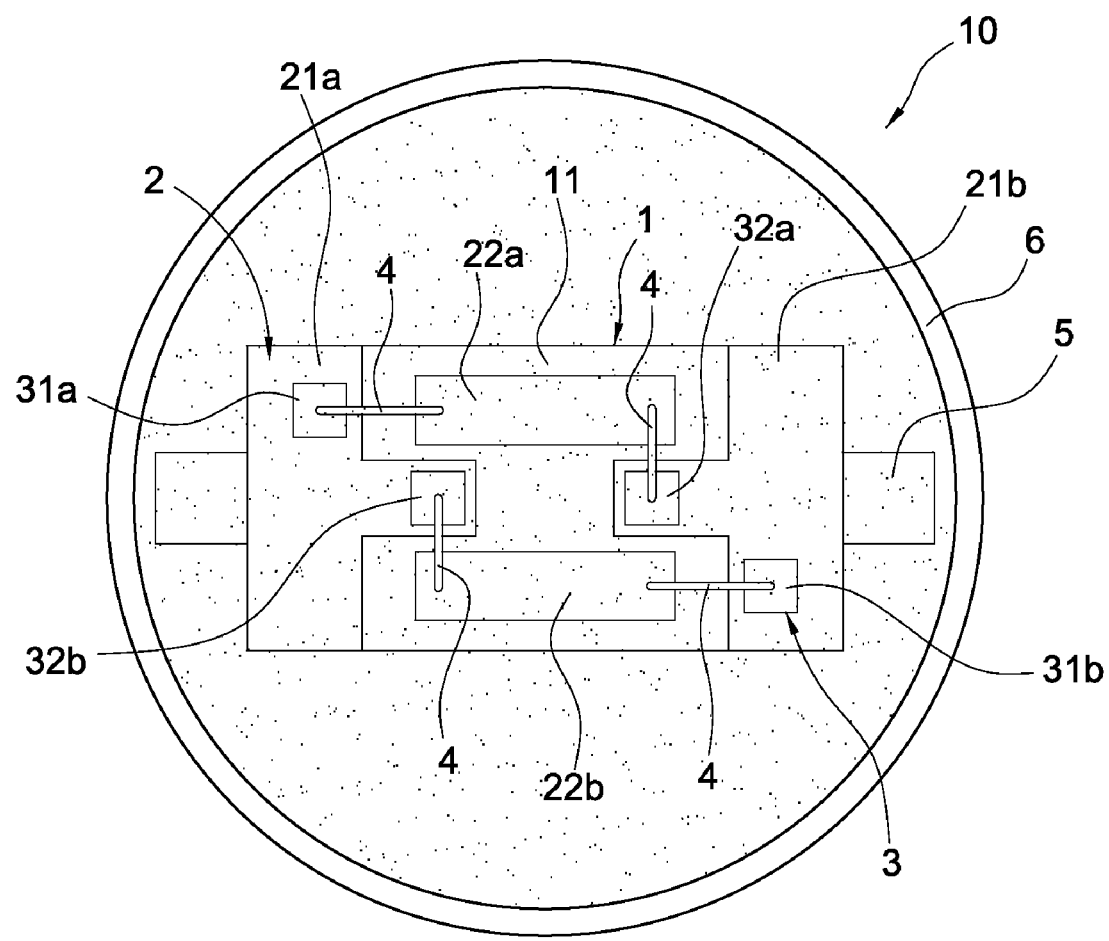
FIG. 3 is a top view of the lamp type light emitting device of the present invention.
Figure 4:
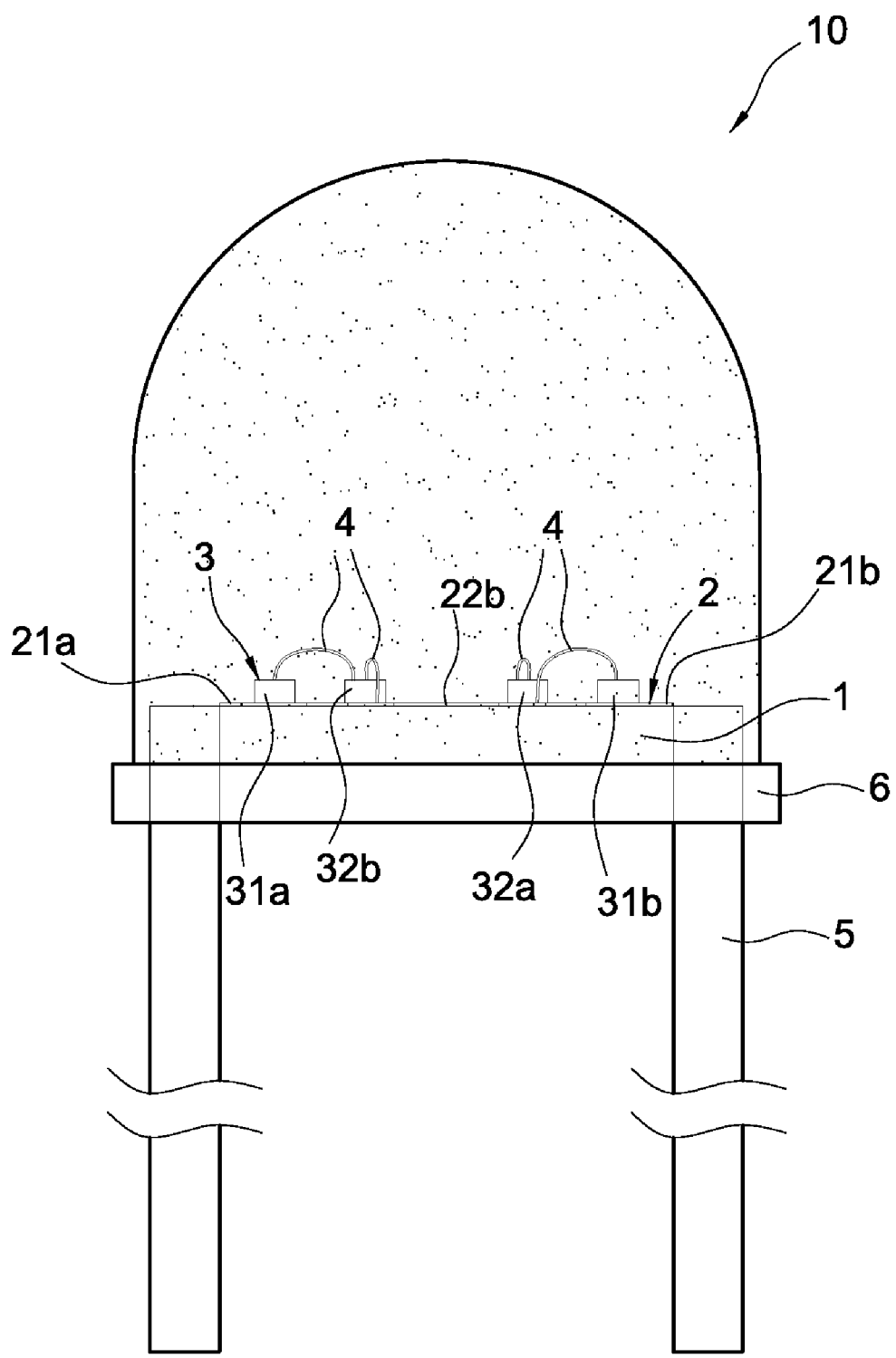
FIG. 4 is a side view of the lamp type light emitting device of the present invention.

FIG. 3 and FIG. 4 respectively show a top view and a side view of the lamp type light emitting device for safety fuse of the present invention. While a positive voltage is applied on the left side lead 5 and a negative voltage is applied on the right side lead 5, the electrical current flows through the first resistor 31*a* and the first light emitting chip 32*a*. Therefore, the first light emitting chip 32*b* will be lighted on.

Similarly, while a negative voltage is applied on the left side lead 5 and a positive voltage is applied on the right side lead 5, the electrical current flows through the second resistor 31*b* and the second light emitting chip 32*b*. Therefore, the second light emitting chip 32*b* will be lighted on.

Figure 5:
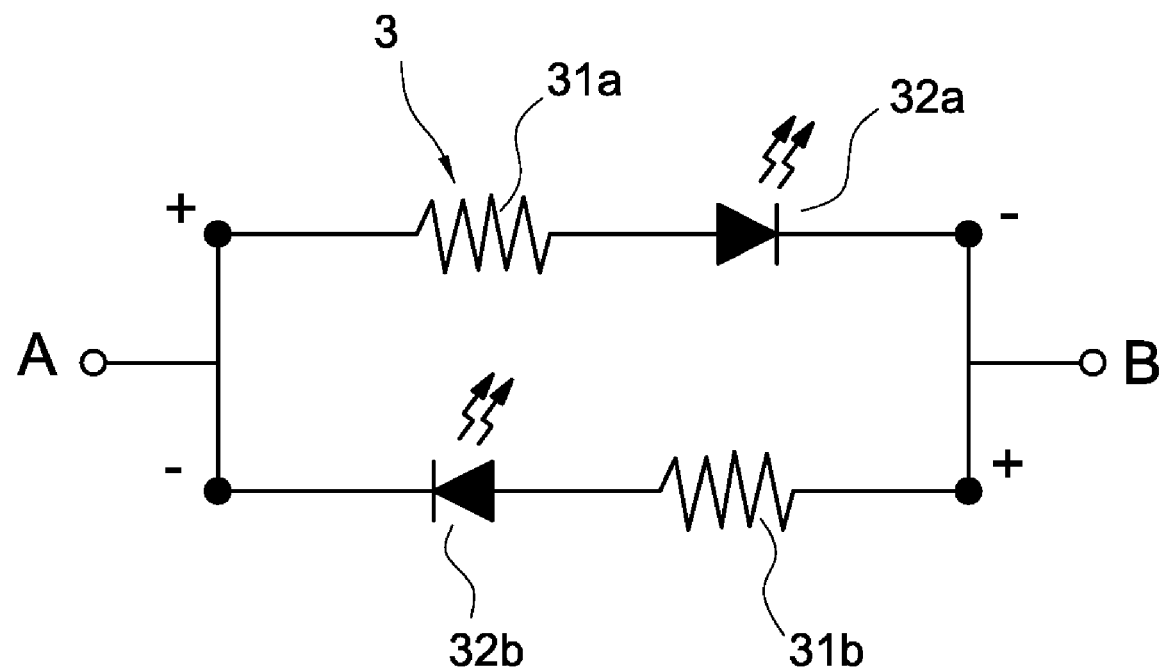
FIG. 5 is a equivalent circuit diagram of the lamp type light emitting device of the present invention.

FIG. 5 shows an equivalent circuit diagram of the lamp type light emitting device of the present invention. The equivalent circuit includes two independent sets of circuits. First set of circuit includes the resistor chip 31*a* and the light emitting chip 32*a* electrically connected in series. Second set of circuit includes the resistor chip 31*b* and the light emitting chip 32*b* electrically connected in series.

The input terminal of the first resistor chip 31*a* is electrically connected to the output terminal of the second light emitting chip 32*b*. The input terminal of the second resistor chip 31*b* is electrically connected to the output terminal of the first light emitting chip 32*a*. Thus, a light emitting circuit with polarity-less operation is formed.

While a positive voltage is applied on the input terminal A and a negative voltage is applied on the input terminal B, the first resistor chip 31*a* and the first light emitting chip 32*a* of the first set of circuit are electrically charged, then the first light emitting chip 32*a* will be lighted on. Similarly, while a negative voltage is applied on the input terminal A and a positive voltage is applied on the input terminal B, the second resistor chip 31*b* and the second light emitting chip 32*b* of the second set of circuit are electrically charged, then the second light emitting chip 32*b* will be lighted on.

Figure 6:
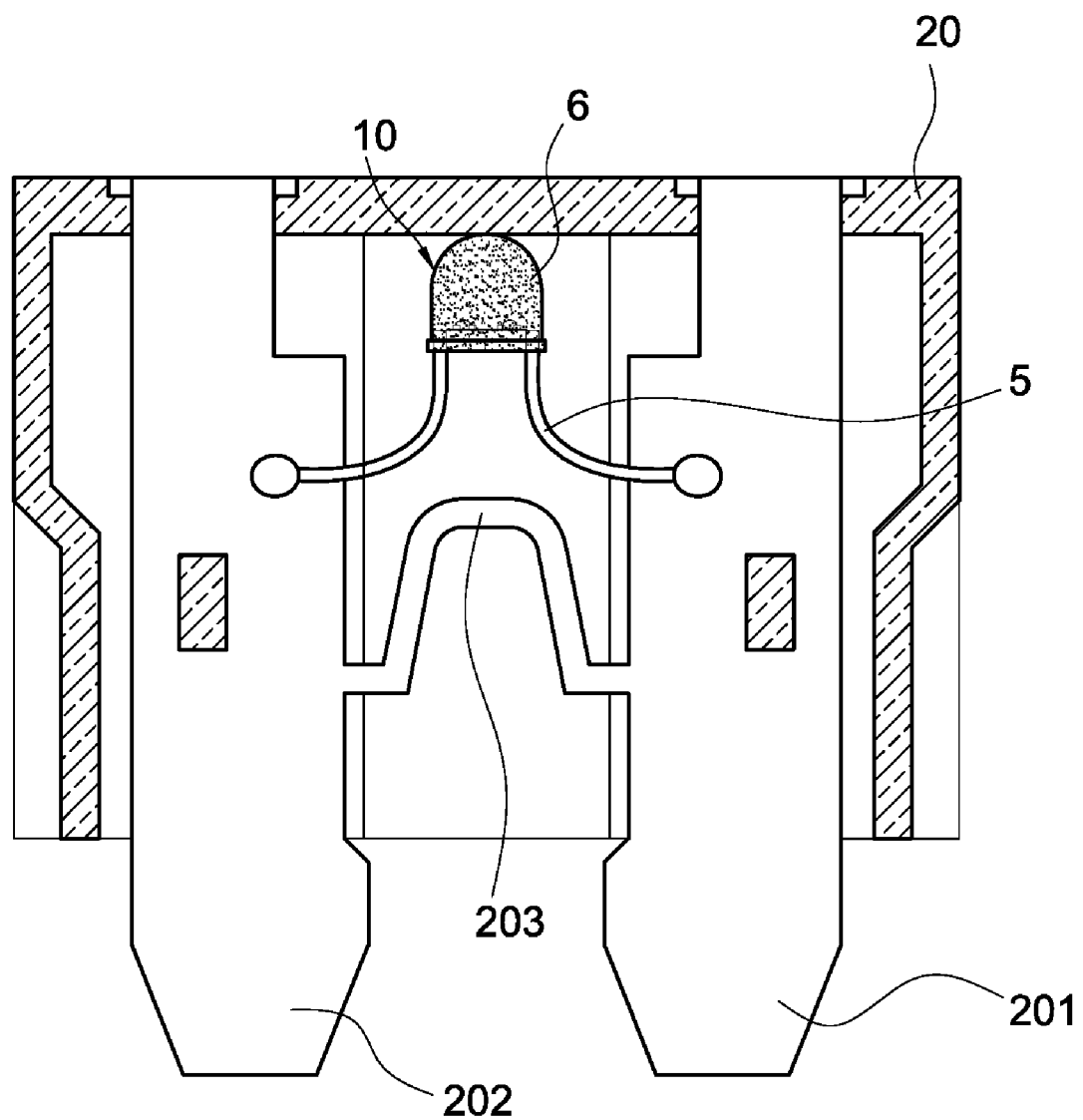
FIG. 6 is a perspective view of car safety fuse with the lamp type light emitting device of the present invention.

FIG. 6 shows a car safety fuse with the lamp type light emitting device of the present invention. The lamp type light emitting device is installed in a shell 20 of the car safety fuse. The two leads 5 are electrical connected to two conductive stripes 201 and 202 in the shell 20 of the safety fuse. When the fuse wire 203 electrically connected between the conductive stripes 201 and 202 is blown by the instantaneous large current flowed from the conductive stripe 201 or 202, at least one of the light emitting chips 32*a*, 32*b* will light on to notice the user for replacement.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A lamp type light emitting device for safety fuse, comprising:
   a substrate having a top surface and a bottom surface;
   an electrode layer arranged on the top surface of the substrate, the electrode layer comprising a first T-shaped electrode, a second T-shaped electrode, a first stripe electrode and a second stripe electrode;
   a chip set comprising a first resistor chip and a first light emitting chip arranged on the first T-shaped electrode and a second resistor chip and a second light emitting chip arranged on the second T-shaped electrode;
   a wire set having a plurality of fuse wires respectively electrically connected the first resistor chip to the first light emitting chip, the first light emitting chip to the first stripe electrode, the second resistor chip to the second light emitting chip, and the second light emitting chip to the second stripe electrode;
   two leads arranged on two opposite sides of the substrate and respectively electrically connected to the first T-shaped electrode and the second T-shaped electrode; and
   an encapsulator encapsulating the electrode layer, the chip set and the wire set.

2. The device according to claim 1, wherein the substrate is made of insulating material.

3. The device according to claim 1, wherein the electrode layer is made from copper foil.

4. The device according to claim 1, wherein the first and second resistor chips are current limiting resistors.

5. The device according to claim 1, wherein the fuse wires of the wire set are gold wires.

6. The device according to claim 1, wherein the encapsulator is made of transparent epoxy resin.

\* \* \* \* \*